United States Patent
Deng et al.

(10) Patent No.: US 12,454,752 B2
(45) Date of Patent: Oct. 28, 2025

(54) METHOD AND APPARATUS FOR FORMING A PATTERNED STRUCTURE ON A SUBSTRATE

(71) Applicant: ASM IP Holding, B.V., Almere (NL)

(72) Inventors: Shaoren Deng, Ghent (BE); David Kurt de Roest, Leuven (BE); Vincent Vandalon, Heverlee (BE); Anirudhan Chandrasekaran, Scottsdale, AZ (US); Yonggyu Han, Leuven (BE); Marko Tuominen, Helsinki (FI)

(73) Assignee: ASM IP Holding B.V., Almere (NL)

( * ) Notice: Subject to any disclaimer, the term of this patent is extended or adjusted under 35 U.S.C. 154(b) by 154 days.

(21) Appl. No.: 18/153,575

(22) Filed: Jan. 12, 2023

(65) Prior Publication Data

US 2023/0227965 A1  Jul. 20, 2023

Related U.S. Application Data

(60) Provisional application No. 63/299,493, filed on Jan. 14, 2022.

(51) Int. Cl.

| | |
|---|---|
| *C23C 16/02* | (2006.01) |
| *C23C 16/04* | (2006.01) |
| *C23C 16/30* | (2006.01) |
| *C23C 16/455* | (2006.01) |
| *C23C 16/513* | (2006.01) |
| *C23C 16/56* | (2006.01) |
| *H01L 21/033* | (2006.01) |

(52) U.S. Cl.
CPC ........ *C23C 16/042* (2013.01); *C23C 16/0227* (2013.01); *C23C 16/0272* (2013.01); *C23C 16/04* (2013.01); *C23C 16/30* (2013.01); *C23C 16/45523* (2013.01); *C23C 16/513* (2013.01); *C23C 16/56* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 6,734,104 B2 * | 5/2004 | Hara | ................. H01L 21/76832 438/692 |
| 8,956,971 B2 | 2/2015 | Haukka et al. | |

(Continued)

FOREIGN PATENT DOCUMENTS

WO  2018213018 A1  11/2018

*Primary Examiner* — Jose I Hernandez-Kenney
(74) *Attorney, Agent, or Firm* — Banner & Witcoff, Ltd.

(57) ABSTRACT

The disclosure relates to the manufacture of semiconductor devices, especially to methods and processing assemblies for forming a patterned structure on a substrate. The methods comprise providing the substrate comprising a first structure into a reaction chamber, wherein a surface of the first structure comprises a first material and the substrate comprises a second material, and selectively depositing a conformal passivation layer on the first material relative to the second material to cover the first structure, and selectively depositing an etch-stop layer on the second material relative to the passivation layer. In some embodiments, a multiple patterning or a tone reversal of a pattern may be performed using the methods and deposition assemblies of the disclosure.

15 Claims, 6 Drawing Sheets

(56) References Cited

U.S. PATENT DOCUMENTS

| | | |
|---|---|---|
| 9,257,303 B2 | 2/2016 | Haukka et al. |
| 9,679,808 B2 | 6/2017 | Haukka et al. |
| 9,895,715 B2 | 2/2018 | Haukka et al. |
| 10,049,924 B2 | 8/2018 | Taukka et al. |
| 10,177,025 B2 | 1/2019 | Pore |
| 10,343,186 B2 | 7/2019 | Pore et al. |
| 10,358,719 B2 | 7/2019 | Yu et al. |
| 10,373,820 B2 | 8/2019 | Tois et al. |
| 10,453,701 B2 | 10/2019 | Tois et al. |
| 10,456,808 B2 | 10/2019 | Haukka et al. |
| 10,695,794 B2 | 6/2020 | Pore et al. |
| 10,814,349 B2 | 10/2020 | Pore et al. |
| 10,854,460 B2 | 12/2020 | Tois et al. |
| 10,923,361 B2 | 2/2021 | Tois et al. |
| 10,991,573 B2 | 4/2021 | Jia et al. |
| 11,081,342 B2 | 8/2021 | Farm et al. |
| 11,094,535 B2 | 8/2021 | Tois et al. |
| 11,145,506 B2 | 10/2021 | Maes et al. |
| 11,213,853 B2 | 1/2022 | Haukka et al. |
| 11,387,107 B2 | 7/2022 | Tois et al. |
| 11,389,824 B2 | 7/2022 | Pore et al. |
| 11,450,529 B2 | 9/2022 | Longrie et al. |
| 2016/0343580 A1* | 11/2016 | Hudson .............. H01L 21/67069 |
| 2017/0110397 A1* | 4/2017 | Wu .................... H01L 21/02282 |
| 2017/0323776 A1* | 11/2017 | Färm ................ C23C 16/45525 |
| 2018/0233350 A1* | 8/2018 | Tois ...................... H01L 23/528 |
| 2018/0261510 A1* | 9/2018 | Qiu .................. H01L 21/76897 |
| 2019/0172701 A1 | 6/2019 | Jia et al. |
| 2019/0341256 A1* | 11/2019 | Shankar ............ H01L 21/31144 |
| 2020/0105515 A1* | 4/2020 | Maes ................ H01L 21/76834 |
| 2020/0324316 A1 | 10/2020 | Pore et al. |
| 2020/0325573 A1* | 10/2020 | Illiberi .................... C23C 16/04 |
| 2021/0013145 A1 | 1/2021 | Gstrein et al. |
| 2021/0175092 A1 | 6/2021 | Tois et al. |
| 2021/0301391 A1 | 9/2021 | Givens et al. |
| 2021/0351031 A1 | 11/2021 | Farm et al. |
| 2021/0358739 A1 | 11/2021 | Tois et al. |
| 2021/0358745 A1 | 11/2021 | Maes et al. |
| 2022/0068634 A1 | 3/2022 | Deng et al. |
| 2022/0181163 A1 | 6/2022 | Illiberi et al. |
| 2022/0193720 A1 | 6/2022 | Haukka et al. |
| 2022/0208542 A1 | 6/2022 | Maes et al. |
| 2022/0208551 A1* | 6/2022 | Heo ...................... H01L 21/467 |
| 2022/0238323 A1* | 7/2022 | Clark ................ H01L 21/76832 |

* cited by examiner

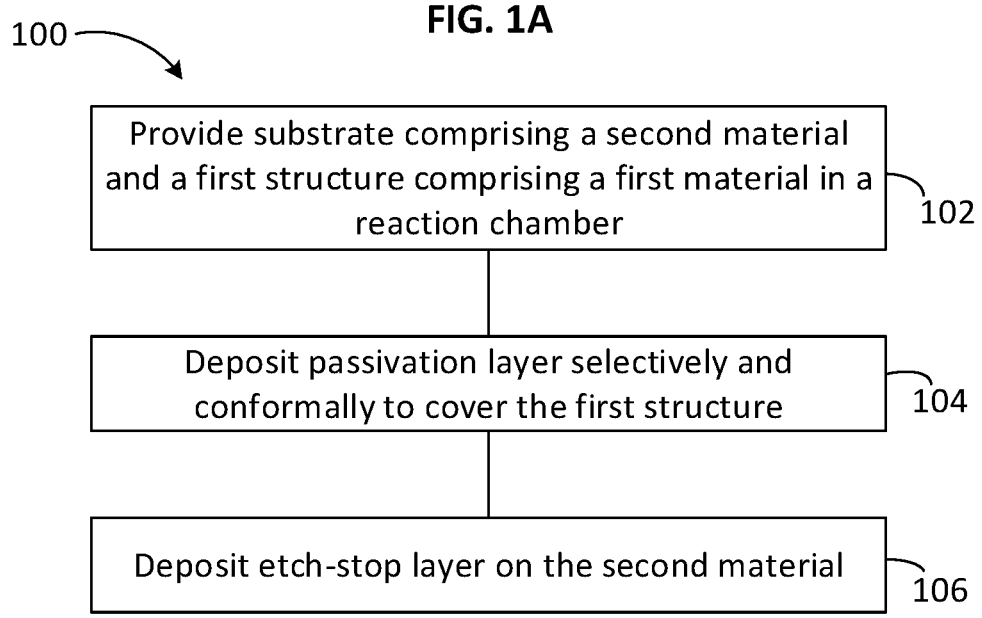
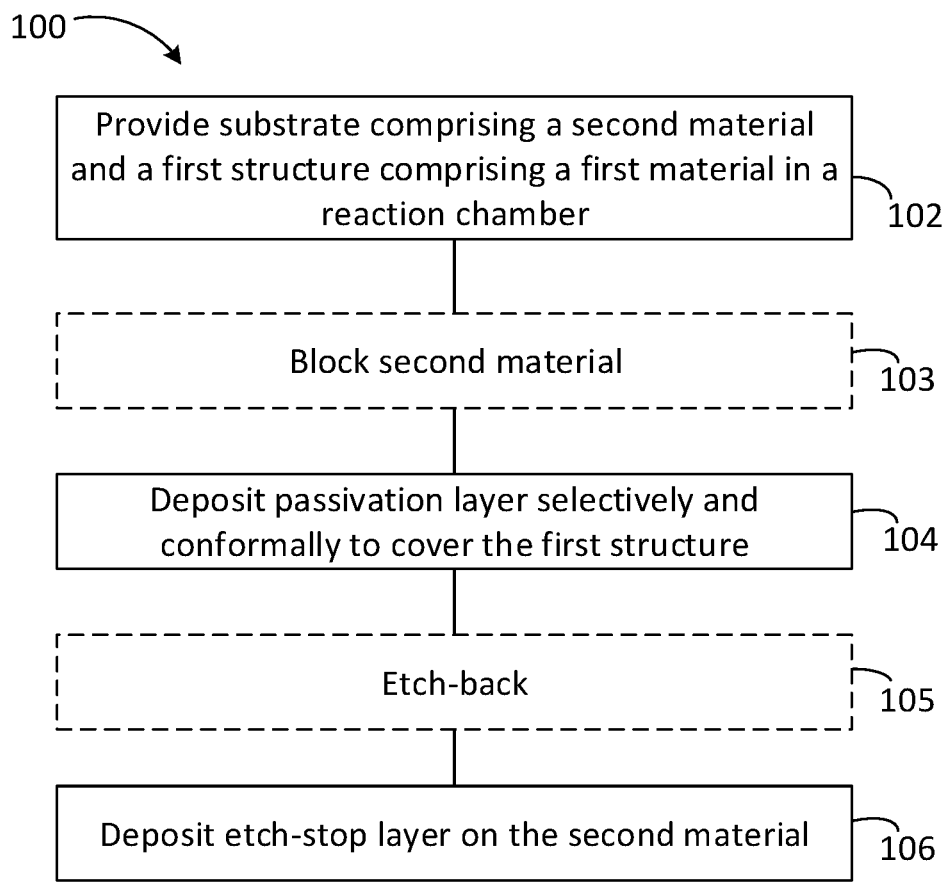

METHOD AND APPARATUS FOR FORMING
A PATTERNED STRUCTURE ON A
SUBSTRATE

FIELD

The present disclosure relates to methods and apparatuses for the manufacture of semiconductor devices. More particularly, the disclosure relates to methods and apparatuses for patterning a semiconductor substrate, and to patterned structures.

BACKGROUND

Semiconductor device fabrication processes generally use advanced methods for creating fine patterns of features on a surface of a substrate by patterning the surface of the substrate and removing material from the substrate surface using, for example, wet etch and/or dry etch processes. As a density of devices on a substrate increases, it becomes increasingly desirable to form features with smaller dimensions.

To regulate the areas from which material is removed, photoresists and hard masks may be used. However, the manufacture of advanced features, such as features with small critical dimensions becomes increasingly challenging with the currently available techniques. For example, when feature density is increased beyond that achievable with simple lithography steps or a pattern is reversed to achieve a narrow structure, various etch-based processes may be utilized. Such approaches rely on etch-stop layers and their thickness is often critical to the accuracy of patterning. The control of such layer thickness remains a challenge, and thus improved methods of forming etch-stop layers during patterning are sought after.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming a patterned structure on a substrate, to patterned structures, and to processing assemblies for forming a patterned structure on a substrate. The methods and apparatuses disclosed herein offer the possibility to simplify patterning processes and/or to improve the accuracy of patterning for features having small critical dimensions. This may allow cost reduction, throughput increase and/or decrease in feature size in manufacturing of semiconductor devices.

In an aspect, a method for forming a patterned structure on a substrate is disclosed. The method comprises providing the substrate comprising a first structure into a reaction chamber, wherein a surface of the first structure comprises a first material and the substrate comprises a second material, selectively depositing a conformal passivation layer on the first material relative to the second material to cover the first structure and selectively depositing an etch-stop layer on the second material relative to the passivation layer.

In some embodiments, the first material comprises a metal. In some embodiments, the metal is a transition metal. In some embodiments, the transition metal is selected from a group consisting of molybdenum, copper, cobalt, ruthenium, tungsten, niobium, zirconium hafnium, yttrium and titanium.

In some embodiments, the first material is a high k material. In some embodiments, the first material is carbon-based.

In some embodiments, the second material comprises silicon. In some embodiments, the second material comprises silicon oxide, silicon nitride, silicon carbide, silicon oxycarbide, amorphous silicon, spin-on glass (SOG) or a combination thereof. In some embodiments, the second material comprises carbon. In some embodiments, the second material comprises an oxide or a nitride. In some embodiments, the second material comprises silicon and titanium.

In some embodiments, the passivation layer comprises an organic polymer. In some embodiments, the organic polymer comprises polyimide.

In some embodiments, the passivation layer is deposited by a cyclic process. In some embodiments, the cyclic process of depositing the passivation layer comprises providing a first passivation material precursor and a second passivation material precursor alternately and sequentially into the reaction chamber.

In some embodiments, the thickness of the passivation layer is from about 1 nm to about 30 nm.

In some embodiments, the method comprises selectively blocking the second material before depositing the passivation layer on the first material. In some embodiments, the blocking comprises a silylation treatment.

In some embodiments, the method further comprises etching the areas of the substrate not covered by the etch-stop layer. In some embodiments, the etch-stop layer comprises a metal oxide. In some embodiments, the metal of the etch-stop layer is selected from aluminum, yttrium, zirconium or combinations thereof. In some embodiments, the etch-stop layer comprises yttrium oxide. In some embodiments, the etch-stop layer is deposited by a cyclic deposition process.

In some embodiments, the cyclic deposition process for the etch-stop layer comprises providing a first etch-stop material precursor and a second etch-stop material precursor into the reaction chamber alternately and sequentially.

In some embodiments, the method comprises etching back the passivation layer anisotropically to partially reveal the first structure before depositing the etch-stop layer. In some embodiments, the anisotropic etching removes horizontal portions of the passivation layer. In some embodiments, the etching back comprises etching with hydrogen-comprising plasma.

In some embodiments, the first material or the second material comprises hard mask material. In some embodiments, the method comprises etching the substrate to remove material from portions not covered by the etch-stop layer.

In one aspect, a method of reversing patterning tone of a patterned substrate is disclosed. Thus, a negative of the pattern existing on the substrate is formed. The method comprises providing a substrate comprising a patterned hard mask into a reaction chamber, wherein a surface of the patterned hard mask comprises a first material and the hard mask is formed on a substrate comprising a second material, selectively depositing a conformal passivation layer on the first material relative to the second material to cover the patterned hard mask, selectively depositing an etch-stop layer on the second material relative to the passivation layer; and selectively etching the substrate not covered by the etch-stop layer. In some embodiments, the pattern of the hard mask comprises a gap extending through the hard mask.

In a further aspect, a method of reducing feature pitch on a substrate is disclosed. The method comprises providing a substrate comprising a patterned hard mask into a reaction chamber, wherein a surface of the patterned hard mask comprises a first material and the hard mask is formed on a substrate comprising a second material, selectively depositing a conformal passivation layer on the first material relative to the second material to cover the patterned hard mask, anisotropically etching the passivation layer to remove horizontal portion of the passivation layer, selectively depositing an etch-stop layer on the first material and the second material relative to the passivation layer and selectively etching portions of the substrate covered by the passivation layer.

In an additional aspect, a semiconductor structure formed by a method according to the current disclosure is disclosed.

In yet another aspect, a semiconductor device comprising a structure according to the current disclosure is disclosed.

In yet an additional aspect, a semiconductor processing assembly for forming a patterned structure on a substrate is disclosed. The processing assembly comprises one or more reaction chambers constructed and arranged to hold the substrate, a precursor injector system constructed and arranged to provide a passivation material precursor and an etch stop material precursor into the reaction chamber in a vapor phase. The processing assembly comprises a first precursor vessel constructed and arranged to contain a passivation material precursor and a second precursor vessel constructed and arranged to contain an etch stop material precursor. The processing assembly is constructed and arranged to provide the passivation material precursor and the etch stop material precursor via the precursor injector system to the reaction chamber to selectively deposit an etch-stop layer on the patterned substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings, FIGS. 1A and 1B are block diagrams of exemplary embodiments of a method according to the current disclosure.

DETAILED DESCRIPTION

Figure 2A:
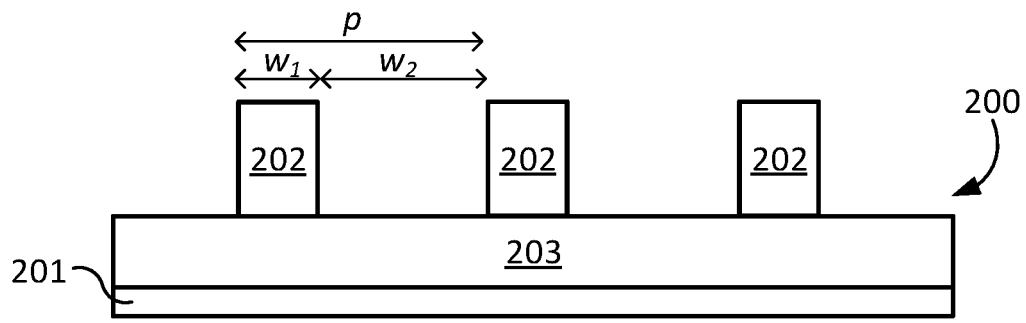
FIGS. 2A-2F are schematic presentations of a method of reducing feature pitch according to the current disclosure.

The description of exemplary embodiments of methods, structures, devices and processing assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

The present disclosure generally relates to methods of forming a patterned structure on a substrate, to semiconductor structures and devices formed using methods described herein, and to semiconductor processing assemblies for performing the methods according to the current disclosure. Structures according to the current disclosure can be used in the formation of devices, such as semiconductor devices. As described in more detail below, various methods can be used to form structures suitable for forming electronic devices.

Exemplary methods can be used to form a patterned structure on a substrate. In the current disclosure, a substrate is patterned and comprises a first structure. The first structure may be, for example, space between holes in a titanium nitride-, titanium oxide- or amorphous carbon-comprising layer. In some embodiments, the first structure may be, for example, a line. The first structures are conformally covered with a passivation layer such that the material between two first structures remains exposed between the structures covered by the passivation layer. The passivation layer may optionally be trimmed, to adjust the exposed area and/or to partially reveal the first structure. Then, an etch-stop layer is deposited on the areas not covered by the passivation layer. As the substrate comprises a second material, etch-stop layer is deposited on the second material. If, optionally, a first structure is partially revealed by etching back the passivation layer, etch-stop layer may be deposited also on such areas. Those areas may comprise first material.

Thereafter, material, including the passivation layer may be etched. Thus, in some embodiments, the method further comprises etching the areas of the substrate not covered by the etch-stop layer. Anisotropic etching may be used to remove any material covered by the passivation layer in the vertical direction. Conversely, material covered by the etch-stop layer in a vertical direction is not etched. Material on such areas thus remains on the substrate.

The etch-stop layer according to the current disclosure may have higher etch resistivity than the other materials on the substrate surface. Thus, the passivation layer may be etched away without damaging the etch-stop layer. In some embodiments, the etch-stop layer is damaged, but the etch-stop layer reduces the damage to the material covered by the etch-stop layer in a vertical direction such that the underlying material is not etched. Thus, the passivation layer, and the materials covered by the passivation layer in a vertical direction may be etched selectively. By selective etching means that the passivation layer and/or materials under the passivation layer in a vertical direction exhibit an etch rate of greater than 20 times, greater than 10 times, greater than 5 times or greater than 2 times the etch rate of the etch-stop layer.

In accordance with further embodiments of the disclosure, a structure is provided. The structure can be formed according to a method as set forth herein. In accordance with further examples of the disclosure, a device comprises or is formed using a structure as described herein.

In accordance with yet additional examples of the disclosure, a processing assembly constructed and arranged to perform a method and/or to form a structure as described herein is provided.

In this disclosure, "gas" can include material that is a gas at normal temperature and pressure (NTP), a vaporized solid and/or a vaporized liquid, and can be constituted by a single gas or a mixture of gases, depending on the context. A passivation material precursor may be provided to the reaction chamber in gas phase. An etch-stop material precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

As used herein, "passivation material precursor" includes a gas or a material that can become gaseous and that can be used to deposit a passivation layer, such as an organic polymer. In some embodiments, passivation layer is deposited using a cyclic deposition process, in which two precursors are used. In such embodiments, the method comprises providing a first passivation material precursor and a second passivation material precursor into the reaction chamber in vapor phase.

As used herein, "etch-stop material precursor" includes a gas or a material that can become gaseous and that can be represented by a chemical formula that includes an element of the etch-stop layer, such as a metal described herein. In embodiments, the etch-stop layer is deposited using a cyclic deposition process, in which two precursors are used. In such embodiments, the method comprises providing a first etch-stop material precursor and a second etch-stop material precursor into the reaction chamber in vapor phase. In some embodiments, the etch-stop layer is deposited using a cyclic deposition process, in which three or more precursors are used. In such embodiment, the method further comprises providing a third and optionally a further etch-stop material precursor into the reaction chamber in vapor phase.

In some embodiments, a precursor, such as a passivation material precursor or an etch-stop material precursor is provided in a mixture of two or more compounds. In a mixture, the other compounds in addition to the precursor may be inert compounds or elements. In some embodiments, a precursor is provided in a composition. Composition may be a solution or a gas in standard conditions.

In this disclosure, performing two processing phases continuously can refer to one or more of the following: without breaking a vacuum, without interruption as a timeline, without any material intervening step, without changing treatment conditions, immediately thereafter or as a next step.

As used herein, the term "layer" and/or "film" can refer to any continuous or non-continuous material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. In some embodiments, a layer according to the current disclosure is substantially continuous.

In the current disclosure, a deposition process may comprise a cyclic deposition process, such as an atomic layer deposition (ALD) process or a cyclic chemical vapor deposition (CVD) process. The term "cyclic deposition process" can refer to the sequential introduction of precursor(s) and/or reactant(s) into a reaction chamber to deposit material, such as passivation layer or etch-stop layer material, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of two precursors may be repeated. In some embodiments, the process comprises or one or more acyclic phases. In some embodiments, the deposition process comprises the continuous flow of at least one precursor. In some embodiments, a precursor may be continuously provided in the reaction chamber. In such an embodiment, the process comprises a continuous flow of a precursor or a reactant. In some embodiments, one or more of the precursors and/or reactants are provided in the reaction chamber continuously.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a nitrogen precursor into the reaction chamber. In some embodiments, the cyclic deposition process comprises purging the reaction chamber after providing each precursor into the reaction chamber.

CVD-type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes (also called pulsed CVD processes), the precursors and/or reactants may be provided to the reaction chamber in pulses that do not overlap, or that partially or completely overlap.

As used herein, the term "purge" refers to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example, in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example, in the case of spatial purges, a purge step can take the following form: moving a substrate from a first location to which a first precursor is continually supplied, through a purge gas curtain or another means of separating the two spaces, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, a cyclic deposition process according to the current disclosure comprises a thermal deposition process. In thermal deposition, the chemical reactions are promoted by increased temperature relevant to ambient temperature. Generally, temperature increase provides the energy needed for the formation of the target material in the absence of other external energy sources, such as plasma, radicals, or other forms of radiation. In some embodiments, the method according to the current disclosure comprises a plasma-enhanced deposition method, for example PEALD or PECVD. For example, in some embodiments, the etch-stop layer deposition may be performed by PEALD or PECVD.

As used herein, silicon oxide refers to a material that includes silicon and oxygen. Silicon oxide can be represented by the formula $SiO_x$, where x can be between 0 and 4, such as between 0 and 2 (e.g., $SiO_2$). In some cases, the silicon oxide may not include stoichiometric silicon oxide. In some cases, the silicon oxide can include other elements, such as carbon, nitrogen, hydrogen, or the like.

Silicon carbide (SiC) can refer to a material that includes silicon and carbon. Silicon carbide need not necessarily be a stoichiometric composition. An amount of silicon can range from 5 to 50 at %; an amount of carbon can range from about 50 to about 95 at %. In some embodiments, SiC films may comprise one or more elements in addition to Si and C, such as H or N.

Silicon oxycarbide (SiOC) can refer to material that comprises silicon, oxygen, and carbon. As used herein, unless stated otherwise, SiOC is not intended to limit, restrict, or define the bonding or chemical state, for example, the oxidation state of any of Si, O, C, and/or any other element in the film. In some embodiments, SiOC thin films may comprise one or more elements in addition to Si, O, and C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC films may comprise from about 0% to about 50% carbon on an atomic basis. In some embodiments, the SiOC films may comprise from about 0.1% to about 40%, from about 0.5% to about 30%, from about 1% to about 30%, or from about 5% to about 20% carbon on an atomic basis. In some embodiments, the SiOC films may comprise from about 0% to about 70% oxygen on an atomic basis. In some embodiments, the SiOC films may comprise from about 10% to about 70%, from about 15% to about 50%, or from about 20% to about 40% oxygen on an atomic basis. In some embodiments, the SiOC films may comprise about 0% to about 50% silicon on an atomic basis. In some embodiments, the SiOC films may comprise from about 10% to about 50%, from about 15% to about 40%, or from about 20% to about 35% silicon on an atomic basis. In some embodiments, the SiOC films may comprise from about 0.1% to about 40%, from about 0.5% to about 30%, from about 1% to about 30%, or from about 5% to about 20% hydrogen on an atomic basis. In some embodiments, the SiOC films may not comprise nitrogen. In some other embodiments, the SiOC films may comprise from about 0% to about 40% nitrogen on an atomic basis (at %). By way of particular examples, SiOC films can be or include a layer comprising SiOCN. In some embodiments, silicon oxycarbide can be represented by the chemical formula $Si_zO_xC_y$, where z can range from about 0 to about 2, x can range from about 0 to about 2, and y can range from about 0 to about 5.

Silicon oxycarbonitride refers to material that comprises silicon, oxygen, nitrogen and carbon. As used herein, unless stated otherwise, SiOCN is not intended to limit, restrict, or define the bonding or chemical state, for example, the oxidation state of any of Si, O, C, N and/or any other element in the film. In some embodiments, SiOCN is material that can be represented by the chemical formula $Si_zO_xC_yN_w$, where z can range from about 0 to about 2, x can range from about 0 to about 2, y can range from about 0 to about 2, and w can range from about 0 to about 2.

A metal carbonitride refers to material that comprises a metal or a metalloid, carbon and nitrogen. refers to material that can be represented by the chemical formula $M_zO_xC_yN_w$, where z can range from about 0 to about 2, x can range from about 0 to about 2, y can range from about 0 to about 2, and w can range from about 0 to about 2. M can be a metal or metalloid, such as one or more of aluminum, titanium, tin, hafnium, zirconium, indium, antimony, tellurium, iodine, cesium, molybdenum, copper, cobalt, ruthenium, tungsten and niobium.

The term metal oxide can refer to metal that includes a metal or metalloid and oxygen. The metal or metalloid can be, for example, one or more of aluminum, titanium, tin, hafnium, zirconium, indium, antimony, tellurium, iodine, cesium, molybdenum, copper, cobalt, ruthenium, tungsten and niobium. The term metal carbide can refer to metal that includes a metal or metalloid and carbon. The metal or metalloid can be, for example, one or more of aluminum, titanium, tin, hafnium, zirconium, indium, antimony, tellurium, iodine, cesium, molybdenum, copper, cobalt, ruthenium, tungsten and niobium.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements, such as thicknesses of material layers, in the figures may be exaggerated relative to other elements to help improve the understanding of illustrated embodiments of the present disclosure. The structures and devices depicted in the drawings may contain additional elements and details, which may be omitted for clarity.

FIG. 1A is a block diagram of exemplary embodiments of a method 100 of forming a patterned structure according to the current disclosure. In the embodiments, a first structure is present on a substrate. The first structure may be, for example, an amorphous carbon line capped with silicon oxide or SOG. In some embodiments, the first structure is a titanium nitride or titanium oxide line with a silicon oxide or silicon nitride cap. In horizontally extending structures, such as lines, a cap is to be understood as a material layer covering substantially the whole topmost surface of the structure. In some embodiments, the first structure is an amorphous carbon layer, titanium nitride layer or titanium oxide layer with holes. In some embodiments, the amorphous carbon layer, titanium nitride layer or titanium oxide layer has a silicon-containing layer, such as silicon oxide, silicon nitride or SOG on top. The substrate itself may comprise a silicon wafer, with optional additional layers, partially and/or fully fabricated devices thereon.

In the first phase 102 depicted in FIG. 1A, a substrate is provided in a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. In some embodiments, as substrate comprises, consist essentially of, or consist of amorphous carbon, spin-on carbon, SOG, amorphous silicon, or silicon carbide. A substrate may comprise, consist essentially of, or consist of a nitride, such as silicon nitride or titanium nitride, a metal, such as copper, cobalt, tungsten, molybdenum, or ruthenium, chalcogenide material, such as molybdenum sulfide. The substrate may comprise various layers forming parts of semiconductor devices.

The topmost material between the structures, i.e. the second material, is chemically distinct from the material covering the first structure. The material covering the first structure, i.e. the first material, may be, for example titanium nitride, titanium oxide, titanium oxycarbide, carbon-based material, such as amorphous carbon, or a combination thereof. The second material may comprise, consist essentially of, or consist of silicon nitride, silicon oxide, silicon oxycarbide, amorphous silicon, poly-silicon or a combination thereof. In some embodiments, the second material is thus a silicon-based material.

In some embodiments, one or both of the first material and the second material may, in fact, comprise different materials, as long as they behave substantially uniformly for the purposes of the current methods. Thus, the surface of the first structures may comprise areas with different compositions. The second surface may also comprise areas of different composition. However, if the passivation layer may be deposited conformally on the first structure while not depositing on any of the second materials, the terms first material and second material may be used for simplicity.

The reaction chamber may be a part of a semiconductor processing assembly. The assembly may be configured and arranged to perform a cyclic deposition process. The reaction chamber can form part of an atomic layer deposition (ALD) assembly. The reaction chamber can form part of a chemical vapor deposition (CVD) assembly. The assembly may be a single wafer reactor. Alternatively, the assembly may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The patterned structures according to the current disclosure may be formed in a cross-flow reaction chamber. The patterned structures according to the current disclosure may be deposited in a showerhead-type reaction chamber. The semiconductor processing assembly according to the current disclosure may be configured and arranged to perform other types of processes than deposition processes. For example, the assembly may be configured and arranged to perform etching.

In some embodiments, the first material comprises, consists essentially of, or consists of a dielectric material. In some embodiments, the first material comprises, consists essentially of, or consists of a metal. In some embodiments, the first material comprises, consists essentially of, or consists of a metallic material. In some embodiments, the first material comprises, consists essentially of, or consists of an elemental metal. In some embodiments, substantially all of the metal is in an elemental form. In some embodiments, the first material comprises, consists essentially of, or consists of a material selected from a group consisting of metal oxide, metal nitride, metal carbide, metal oxycarbide and amorphous carbon. In some embodiments, the first material does not comprise silicon. In some embodiments, the metal is in a compound and has a formal oxidation state higher than 0. In some embodiments, the metal is in a metal nitride. In some embodiments, the metal nitride is a titanium nitride or titanium oxynitride. In some embodiments, the metal is in a metal oxide. In some embodiments, the metal oxide is aluminum oxide, hafnium oxide, zirconium oxide, titanium oxide. In some embodiments, the metal is in a metal carbide. In some embodiments, the metal carbide is titanium aluminum carbide or titanium carbide. In some embodiments, the metal is a transition metal. In some embodiments, the transition metal is selected from a group consisting of molybdenum, copper, cobalt, ruthenium, tungsten, niobium, zirconium hafnium and titanium.

In some embodiments, the first material is a high k material, such as hafnium oxide—comprising material, a lanthanum oxide-comprising material. In some embodiments the dielectric material comprises a metal oxide. In some embodiments, the first material is carbon-based. By carbon-based materials is herein meant for example amorphous carbon and doped carbon, such as boron-doped carbon and diamond-like carbon and $sp^2/sp^3$ hybrid carbon material. In some embodiments, the first material comprises, consists essentially of, or consists of amorphous carbon. In some embodiments, the first material comprises, consists essentially of, or consists of, titanium nitride. In some embodiments, the first material comprises, consists essentially of, or consists of, titanium oxide. In some embodiments, the first material comprises, consists essentially of, or consists of, titanium oxynitride. In some embodiments, the first material comprises, consists essentially of, or consists of carbide material. In some embodiments, the carbide material is boron carbide.

In some embodiments, the second material is a dielectric material. In some embodiments, the second material comprises silicon. In some embodiments, the second material is a low-k material. In some embodiments, the second material comprises an oxide. In some embodiments, the second material comprises a nitride. Examples of silicon-comprising dielectric materials include silicon oxide-based materials, including grown or deposited silicon dioxide, doped and/or porous oxides and native oxide on silicon. In some embodiments, the second material comprises silicon oxide. In some embodiments, the second material is a silicon oxide material, such as a native oxide material, a thermal oxide material or a chemical oxide material. In some embodiments, the second material comprises SiN. In some embodiments, the second material comprises carbon. In some embodiments, the second material comprises SiOC. In some embodiments, the second material comprises carbon, such as silicon oxycarbide. In some embodiments, the second material comprises an oxide or a nitride. In some embodiments, the second material comprises silicon oxide, silicon nitride, silicon carbide, silicon oxycarbide or a combination thereof.

In some embodiments, the second material may be a $SiO_2$-based surface. In some embodiments, the second material may comprise Si—O bonds. In some embodiments, the second material may comprise a $SiO_2$-based low-k material. In some embodiments, the second material may comprise more than about 30%, or more than about 50% of $SiO_2$. In certain embodiments, the second material comprises a silicon dioxide surface. In some embodiments, the second material comprises, consist essentially of, or consist of amorphous silicon. In some embodiments, the second material comprises, consist essentially of, or consist of polysilicon.

In the phase 104, passivation layer is selectively deposited on the first material relative to the second material. Selectivity of the deposition can be given as a percentage calculated by [(deposition on first material)-(deposition on second material)]/(deposition on the first material). Deposition can be measured in a variety of ways. In some embodiments, deposition may be given as the measured thickness of the deposited material. In some embodiments, deposition may be given as the measured amount of material deposited. Thus, the passivation layer grows preferentially on the first material, while it is deposited to a lesser extent, or not at all, on the second material. In some embodiments, deposition of the passivation layer on the first material relative to the second material is at least about 90% selective, which may be selective enough for some particular applications. In some embodiments, deposition of the passivation layer on the first material relative to the second material is at least about 80% selective, which may be selective enough for some particular applications. In some embodiments the deposition on the first material relative to the second material is at least about 50% selective, which may be selective enough for some particular applications.

In some embodiments, the passivation layer is deposited to substantially to cover the first structure. The uniform and accurate coverage of the first structure may be advantageous in further processing of the substrate. The thickness of the passivation layer determines the area available for the deposition of an etch-stop layer. This will in its turn determine the area that remains susceptible to etching steps. In some embodiments, the thickness of the passivation layer is at least about 0.5 nm. In some embodiments, the thickness of the passivation layer is at least about 1 nm. In some embodiments, the thickness of the passivation layer is at least about 3 nm. In some embodiments, the thickness of the passivation layer is at least about 5 nm.

In some embodiments, the thickness of the passivation layer is less than about 20 nm, or less than about 15 nm. In some embodiments, the thickness of the passivation layer is less than about 10 nm, or less than about 8 nm. In some embodiments, the thickness of the passivation layer is from about 0.5 nm to about 30 nm. In some embodiments, the thickness of the passivation layer is from about 1 nm to about 30 nm. In some embodiments, the thickness of the passivation layer is from about 3 nm to about 30 nm. In some embodiments, the thickness of the passivation layer is from about 5 nm to about 30 nm. In some embodiments, the thickness of the passivation layer is from about 0.5 nm to about 15 nm. In some embodiments, the thickness of the passivation layer is from about 0.5 nm to about 10 nm. In some embodiments, the thickness of the passivation layer is from about 0.5 nm to about 7 nm. In some embodiments, the thickness of the passivation layer is from about 0.5 nm to about 5 nm. For example, the thickness of the passivation layer may be about 2 nm, about 6 nm, about 7 nm or about 12 nm.

The purpose of depositing passivation layer on the first structure is to avoid the deposition of etch-stop layer on areas that are to be etched. The passivation layer is a sacrificial material that is not necessarily present in the final structure or device according to the current disclosure. The passivation layer is used to guide the deposition of the etch-stop layer to form the desired pattern on the substrate surface.

In some embodiments, the process according to the current disclosure comprises depositing a passivation layer on the first material to selectively passivate the first material for selectively depositing an etch-stop layer on the second material. In some embodiments, the passivation layer comprises an organic polymer. The passivation layer may be deposited by a cyclic vapor deposition process. The deposition of passivation layer may comprises providing a first passivation material precursor, such as acetic anhydride, and a second passivation material precursor, such as a diamine, alternately and sequentially into the reaction chamber. An organic polymer passivation layer may be selectively formed on the first (for example metal-containing) material relative to the second material by providing a passivation agent into the reaction chamber. A passivation layer may be provided by a cyclic deposition process. For example, polyimide-comprising passivation layer may be deposited by providing an acetic anhydride and a diamine alternately and sequentially into a reaction chamber to form a passivation layer on the first surface. The passivation layer may be selectively deposited on the first material by providing a passivating agent into the reaction chamber. In some embodiments, the passivating material on the metal, metallic or dielectric first surface inhibits, prevents or reduces the formation of the etch-stop layer on the first surface. In some embodiments, the organic polymer comprises polyimide.

In some embodiments, the cyclic process comprises providing a first passivation material precursor and a second passivation material precursor alternately and sequentially into the reaction chamber. For example, the first passivation material precursor may be an acetic anhydride, such as pyromellitic dianhydride, the second passivation material precursor may be a diamine, such as a 1,6-diaminohexane.

At phase 106, an etch-stop layer is selectively deposited on the second material relative to the passivation layer. At this phase, the surface of the substrate comprises the second material and the passivation layer, and the etch-stop layer is selectively deposited on the second material relative to the passivation layer. In some embodiments, the etch-stop layer is deposited by a cyclic deposition process. In some embodiments, the etch-stop layer is deposited by providing a first etch-stop material precursor and a second etch-stop material precursor alternately and sequentially into the reaction chamber. In some embodiments, an ALD process is used in depositing the etch-stop layer. In some embodiments, a cyclic CVD process is used in depositing the etch-stop layer.

In some embodiments, the etch-stop layer comprises a metal oxide. In some embodiments, the etch-stop layer comprises a metal oxide comprising two metals. In some embodiments, the etch-stop layer comprises a metal oxide comprising three metals. In some embodiments, the metal of the etch-stop layer is selected from titanium, aluminum, yttrium, zirconium or combinations thereof. In some embodiments, the etch-stop layer comprises, consists essentially of, or consists of titanium oxide. In some embodiments, the etch-stop layer comprises, consists essentially of, or consists of aluminum oxide. In some embodiments, aluminum oxide is doped with another metal. In some embodiments, the etch-stop layer comprises, consists essentially of, or consists of yttrium oxide. In some embodiments, yttrium oxide is doped with another metal. In some embodiments, the etch-stop layer comprises, consists essentially of, or consists of zirconium oxide. In some embodiments, the etch-stop layer comprises, consists essentially of, or consists of aluminum-doped yttrium oxide. In some embodiments, the etch-stop layer comprises, consists essentially of, or consists of yttrium-doped aluminum oxide. In some embodiments, the etch-stop layer comprises, consists essentially of, or consists of zirconium-doped aluminum oxide. In some embodiments, the etch-stop layer comprises, consists essentially of, or consists of zirconium-doped yttrium oxide. In some embodiments, the etch-stop layer comprises, consists essentially of, or consists of yttrium silicon oxide. In some embodiments, the etch-stop layer comprises a nitride. In some embodiments, the nitride is titanium nitride or titanium oxynitride.

FIG. 1B is a block diagram of other exemplary embodiments of a method of forming a patterned structure according to the current disclosure. Phases 102, 104 and 106 are as presented for FIG. 1A above. However, in embodiments of FIG. 1B, an additional phase 103 of selectively blocking the second material is performed before depositing the passivation layer at phase 104. The purpose of the blocking phase 103 may be to enable or improve the selective deposition of the passivation layer on the first material. The nature of the blocking phase 103 depends on the materials used in the embodiment in question. In some embodiments, blocking is performed by exposing the substrate to a blocking chemistry, which may modify and/or adsorb on the first material. Blocking may also be performed by cleaning one or both of first material surface and second material surface, by reducing the surfaces etc.

In some embodiments, blocking may be performed by a silylation treatment. A silylating agent such as alyltrimethylsilane (TMS-A), chlorotrimethylsilane (TMS-CI), N-(trimenthylsilyl)imidazole (TMS-Im), octadecyltrichlorosilane (ODTCS), hexamethyldisilazane (HMDS), or N-(trimethylsilyl)dimethylamine (TMSDMA) may be used to silylate the second material. The substrate may be contacted with a sufficient quantity of the blocking agent and for a sufficient period of time that the second surface is selectively blocked with silicon species. In some embodiments, the second material is not passivated with a self-assembled monolayer.

In some embodiments, the passivation layer comprises to a large extent of polyimide polymers, with possibly some polyamic acid included in the material. For example in such embodiments, the second material may be blocked by a silylation treatment alyltrimethylsilane (TMS-A), chlorotrimethylsilane (TMS-CI), N-(trimenthylsilyl)imidazole (TMS-Im), octadecyltrichlorosilane (ODTCS), hexamethyldisilazane (HMDS) or N-(trimethylsilyl)dimethylamine (TMSDMA) to improve the selectivity between the first material and second material. For example, a temperature during the silylation process may be from about 50° C. to about 500° C., or from about 100° C. to about 300° C. Due to the blocking treatment, the etch-stop layer of, for example, metal oxide, such as aluminum oxide-containing oxide, is selectively deposited on the second material. This may allow accurate etching of the desired areas.

In the embodiments illustrated in FIG. 1B, the passivation layer may be etched back at phase 105. Thus, in some embodiments, the method according to the current disclosure comprises an etch-back phase to adjust the surface of the passivation layer before depositing the etch-stop layer (phase 105). For example, the selectivity of depositing the passivation layer may be improved by removing some passivation material from the second surface. The removal may be made intermittently with depositing the passivation layer, or after depositing the passivation layer. Etching back may include removing an optional blocking agent from the second surface, or another treatment. Alternatively, etching back may be performed anisotropically to partially reveal the first structure. In such situations, for example, passivation layer on vertical sides of a first structure may remain substantially intact, whereas passivation layer on horizontal surfaces exposed to the etching treatment, such as any horizontal surfaces of the first structure and/or horizontal portions of the substrate is etched. In some embodiments, the method comprises etching back the passivation layer anisotropically to partially reveal the first structure before depositing the etch-stop layer. In some embodiments, the anisotropic etching removes horizontal portions of the passivation material. In some embodiments, the etching back comprises etching with hydrogen-comprising plasma. In etching back the passivation layer, low plasma power, such as below 70 W may be used. However, the specific plasma conditions may depend on the specific materials and processing conditions and may be determined case-by-case.

Etching back 105 may be performed by a plasma treatment. In some embodiments, the plasma may comprise oxygen atoms, oxygen radicals, oxygen plasma, or combinations thereof. In some embodiments, the plasma treatment may be performed by hydrogen-comprising plasma. In some embodiments, the plasma may comprise hydrogen atoms, hydrogen radicals, hydrogen plasma, or combinations thereof. In some embodiments, the plasma may comprise noble gas species, for example Ar or He species. In some embodiments, the plasma may consist essentially of noble gas species. In some embodiments, the plasma may comprise other species, for example nitrogen atoms, nitrogen radicals, nitrogen plasma, or combinations thereof. In some embodiments, the etching back may comprise exposing the substrate to an etchant comprising oxygen, for example $O_3$. In some embodiments, the substrate may be exposed to an etchant at a temperature of between about 30° C. and about 450° C., or between about 100° C. and about 400° C. In some embodiments, the etchant may be supplied in one continuous pulse or may be supplied in multiple pulses In some embodiments, the passivation layer may be annealed. In some embodiments, annealing may be carried out after etching back. Annealing may be carried out in the same reaction chamber as the deposition of the passivation layer, the same reaction chamber as the etch-back process, or may be carried out in a separate reaction chamber with one or more of those aspects of the process. In some embodiments annealing is carried out in a reaction chamber that is part of a cluster tool and the substrate is moved to one or more different reaction chambers of the cluster tool for additional processing after annealing.

In some embodiments the substrate is annealed for a period of about 1 to about 15 minutes. In some embodiments the substrate is annealed at a temperature of about 200 to about 500° C. In some embodiments the anneal step comprises two or more steps in which the substrate is annealed for a first period of time at a first temperature and then annealed for a second period of time at a second temperature.

Both phases 103 and 105 are optional, and only one of them or both can be performed. In some embodiments, blocking 103, etching back 105 or both may be done in combination of one or more treatments, such as plasma clean and oxidation or reduction.

FIGS. 2A-2F shows a schematic illustration of a multiple patterning scheme performed by the methods disclosed herein. In the method, the pitch of the features is reduced. FIG. 2A indicates a semiconductor substrate 200 comprising first structures 202 formed on silicon substrate 201. The first structures 202 may have been formed on the substrate 201 by conventional patterning methods. The first structures 202 in FIGS. 2A-2F are titanium-containing, such as titanium nitride-containing or titanium oxide-containing, lines formed on silicon-based material 203, which is the second material. The silicon-based material 203 may be, for example, silicon oxide, silicon nitride or another silicon-containing material disclosed herein. As explained earlier, it is not necessary for the functioning of the invention that the second material 203 is the same across the whole area of deposition, as long as it behaves sufficiently uniformly. Although in the embodiment of FIGS. 2A-2F, there is only one material layer 203 above the silicon substrate 201, there may be a number of different layers, with structures, devices, partially fabricated devices etc. present in addition to, or including, the layer on the surface of the substrate 203.

In the embodiment of FIGS. 2A-2F, the first structures 202 are formed as having a rectangular cross section. However, the first structures 202 may have various shapes, depending on the application in question. The height, width and aspect ratio of the first structures 202 may be variable. In some embodiments, the width of a first structure 202 ($w_1$) according to the current disclosure may be from about 5 nm to about 30 nm, such as about 10 nm illustrated in FIGS. 2A-2F. The height of a first structure 202 may be, for example, from about 5 nm to about 100 nm. In some embodiments, the distance between two structures ($w_2$) according to the current disclosure is from about 2 nm to about 50 nm, or from about 2 nm to about 30, from about 2 nm to about 15 nm, or from about 2 nm to about 10 nm. For example, the distance between two structures is about 30 nm, about 22 nm or about 12 nm.

The pitch between the first structures 202, indicated by p in FIG. 2A, may be, for example, less than about 40 nm, less than about 35 nm, such as about 32 nm, less than about 30 nm, less than about 20 nm, less than 25 nm, or less than about 20 nm, such as about 16 nm, or less than about 15 nm. The use of the method according to the current disclosure is not limited by the pitch or dimensions of the structures, as the limiting factor may be performing the preceding lithography processes to obtain the pattern. The thickness of the deposited passivation layer is selected to match the critical distance of the etched gap (and conversely the pillars or other structures remaining after the etch, depending on the embodiment).

The current disclosure is not limited to devices or materials described above, but the current method of forming a patterned structure can find use in various processing schemes in the manufacture of semiconductor devices. In the embodiment of FIGS. 2A-2F, the first material 202 may be, for example, titanium nitride, titanium oxide, titanium oxynitride or amorphous carbon, and the second material 203 may be, for example, silicon nitride, silicon oxide, SOG, amorphous silicon or silicon oxycarbide.

Figure 2B:
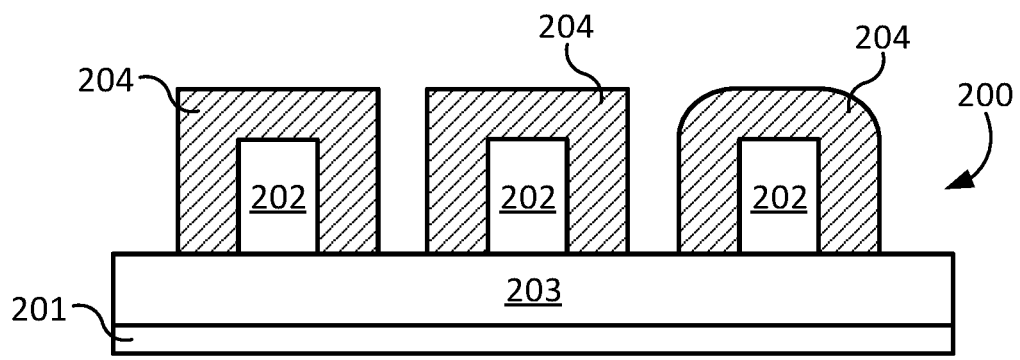

FIG. 2B indicates the substrate with the first structures 202 after a passivation layer 204 has been deposited on them conformally. In the illustrated embodiment, the thickness of the passivation layer 204 is about 6 nm. For example, when using a cyclic deposition process to deposit a polyimide-containing or polyamic acid-containing passivation layer 204, the thickness of the passivation layer 204 may be adjusted. In some embodiments, the thickness of the passivation layer 204 is from about 0.5 nm to about 3 nm, or from about 1 nm to about 5 nm. Although the passivation layer 204 is drawn in FIG. 2B to have a substantially angular shape, in many embodiments, a more rounded profile may be obtained (as drawn on the right-most structure 202).

The apparent growth of the passivation layer 204 on the second surface 203 is due to the growth of the passivation layer 204 in thickness. In other words, the passivation layer 204 does not actually grow on the second surface to an appreciable extent, but rather extends over it as it grows from the sidewall of the first structure 202.

Figure 2C:
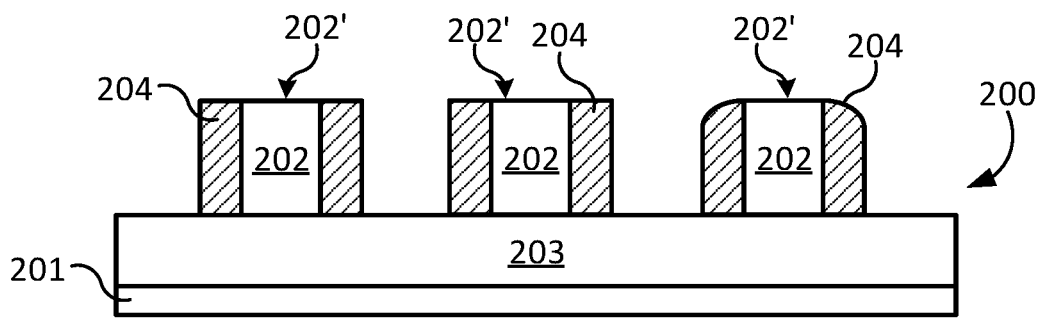

In FIG. 2C, the passivation layer has been etched back anisotropically to reveal the horizontal top surface 202' of the first structure 202. The revealed surface 202' comprises first material. Again, in some embodiments, the passivation layer 204 has a rounded profile after the etch-back phase, as schematically indicated in the right-most structure 202. Etching back may be performed by a plasma treatment, for example.

Figure 2D:
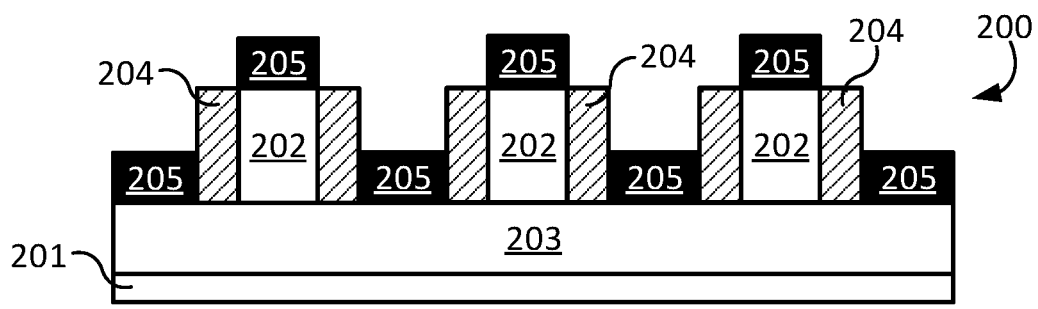

In FIG. 2D, an etch-stop layer 205 has been selectively deposited on the second surface 203 relative to the passivation layer 204. In the embodiments of FIG. 2D, the etch-stop layer 205 is additionally deposited on the first surface 202' revealed by the etch-back phase of FIG. 2C. Thus, the etch-stop layer 205 is selectively deposited on other surfaces present on the substrate, but not on the passivation layer 204. The etch-stop layer 204 may be composed of any etch-stop layer material described herein. Especially suitable material combinations may be a polyimide-containing passivation layer 204 material and a metal oxide-containing etch-stop layer 205 material. In some embodiments, the etch-stop layer 205 material is selective against the chosen passivation layer 204 material, and is sufficiently etch-resistant to withstand the etching conditions used to etch a suitable depth of material around the etch-stop layer 205.

The first structures 202 may patterned and deposited with conventional methods, after which the conformal deposition of a passivation layer 204 of desired thickness together with the etch-stop layer 205 allows for the decrease in feature pitch. As the etch-stop layer 205 is only deposited on areas not covered by the passivation layer 204, the passivation layer 204—covered areas—i.e. areas to be etched—remain free of etch-stop layer.

Figure 2E:
Figure 2F:
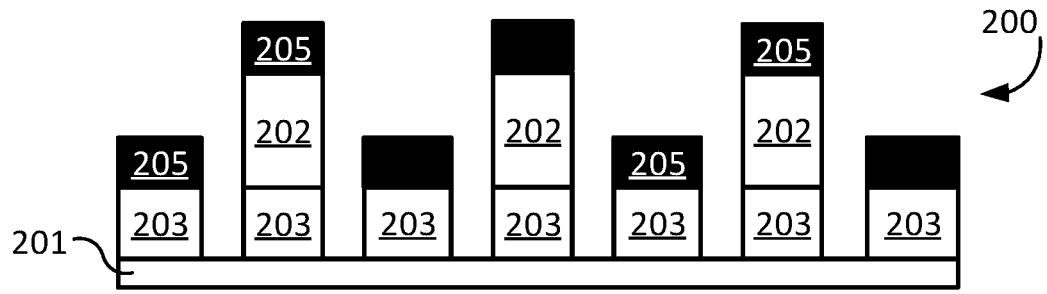

FIGS. 2E and 2F illustrate the substrate at different stages of etching. In FIG. 2E, the passivation layer 204 has been etched away, and the substrate surface 203 remains exposed to the continued etching. In FIG. 2F, the substrate material 203 above the silicon wafer material 201 has been etched. Is indicated above, there may be multiple materials on the silicon substrate 201, and all or some of them may be etched in the process. Therefore, depending on the application, also the necessary etch resistance and thickness of the etch-stop layer 205 vary according to application. The etching of FIG. 2F may be performed to a depth necessary for the application in question, and it can be performed through multiple material layers of varying thickness, although only a single material is depicted in the figure.

FIGS. 2E and 2F also illustrate that the width of the gap to be etched depends on the thickness of the passivation layer 204. More precisely, the width of the gap to be etched depends on the thickness of the passivation layer 204 at the sidewall of the first structure 202 remaining after the etch-back process. Further, it may be possible that the first structure 202 is a sacrificial material, formed only for patterning purposes. Therefore, it may be possible to omit the etch-back phase, and allow the first structure 202 to be etched.

FIGS. 3A-3D show another exemplary embodiment of a multiple patterning scheme performed by the methods disclosed herein. As above in FIGS. 2A-2F, FIG. 3A indicates a semiconductor substrate 200 comprising first structures 202 formed on silicon substrate 201. The material and shape of structures 202 in FIGS. 3A-3D, as well as that of the underlying material 203 may be same or similar as in FIGS. 2A-2F. However, the first structures 202 comprise a cap 206 of capping material. The cap 206 may be deposited before patterning as a uniform layer, or after patterning using toposelective methods. The method of cap formation may be form in many alternative ways known in the art. The material of the cap 206 may be, for example, silicon-containing material. It may be same or similar as that of layer 203.

Figure 3A:
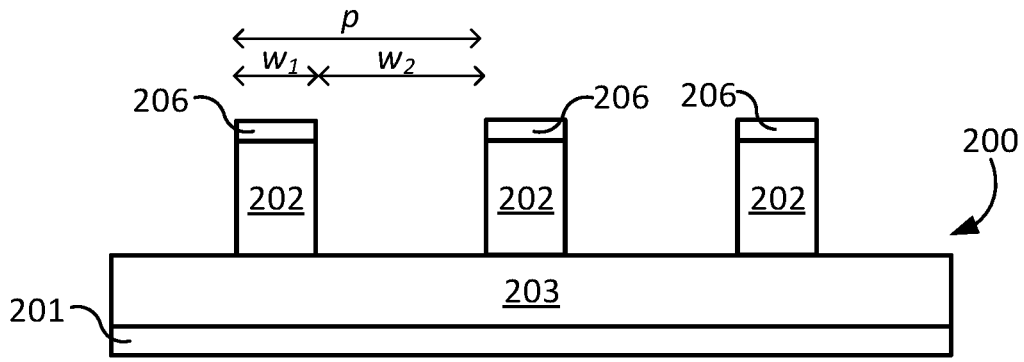
FIGS. 3A-3D are schematic presentations of a multiple patterning scheme performed by the methods according to the current disclosure.
Figure 3B:
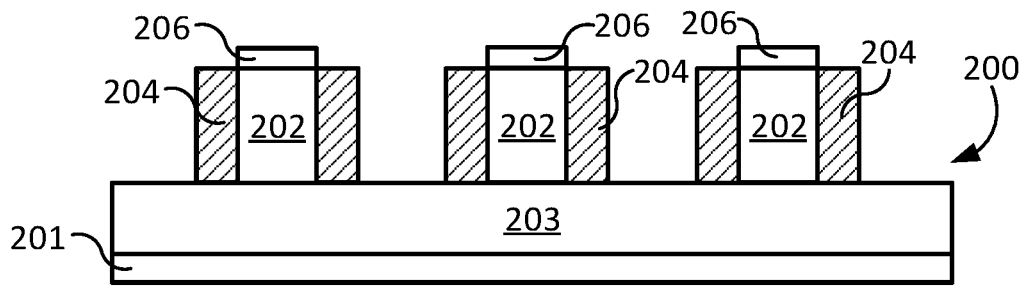
Figure 3C:
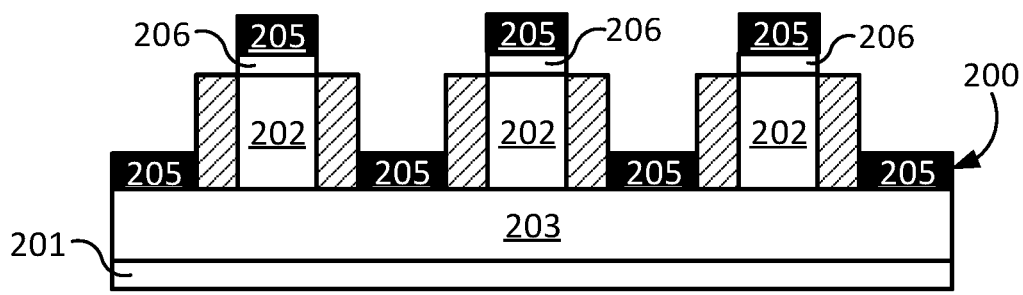
Figure 3D:
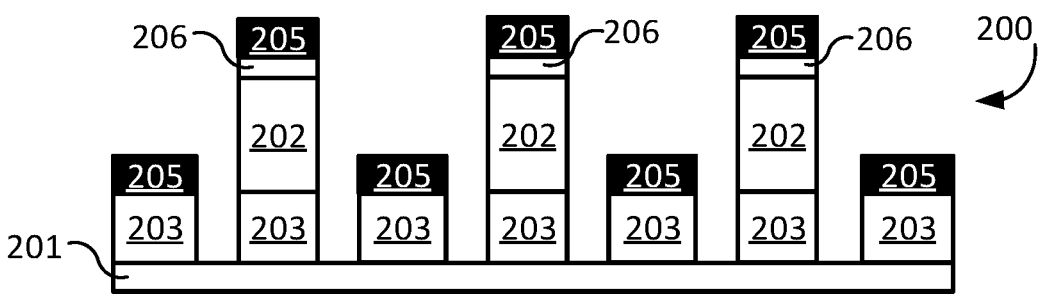

Significantly, passivation layer 204 is not grown on the cap 206, as depicted in FIG. 3B, illustrating the conformal deposition of passivation layer 204. Thus, as visible in FIG. 3C, etch-stop layer 205 grows on the cap 206 leading to a similar patterning result as the embodiment of FIGS. 2A-2F without performing an etch step. As the etch-stop material may grow on the cap 206 material, the area becomes protected from etching with a smaller number of process steps, which may have advantages in some embodiments. The fully etched end result of performing the method is depicted in FIG. 3D.

FIGS. 4A-4D show a schematic illustration of exemplary embodiments of the method according to the current disclosure in which the tone of patterning is reversed.

Figure 4A:
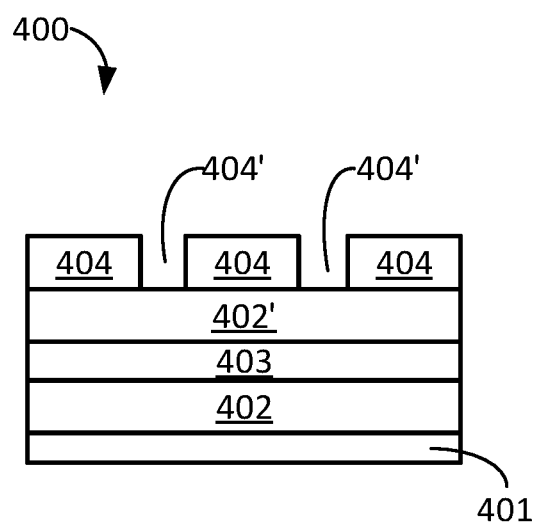
FIGS. 4A-4D are schematic presentations of a method of reversing the tone of a pattern according to the current disclosure.

FIG. 4A depicts a substrate 400 comprising multiple material layers 402, 403 on a silicon substrate 401 before the deposition of a passivation layer 405. A material layer 404 comprising, for example, amorphous carbon, has been deposited and a pattern has been transferred thereon (gaps 404'). The material layer 404 may be a hard mask, and comprise hard mask materials known in the art. Examples of hard mask materials include titanium nitride, titanium oxide, amorphous carbon and spin-on carbon. The patterned material layer 404 comprises a gap 404' extending to the topmost layer 402' on the substrate. The patterned material layer 404 forms the first structure according to the current disclosure, and in the example of FIGS. 4A-4D, the material of the patterned material layer is the first material. Two of the underlying layers 402 and 402' in the embodiment of FIGS. 2A-2F are the same material, but they could be different. The topmost material layer 402' forms the second material according to the current disclosure. In the depicted embodiment, it is silicon-comprising material, such as silicon nitride or silicon oxide. A material layer comprising a metal, such as a titanium nitride layer 403, is positioned between the two layers of silicon-comprising material 402, 402'.

Although multiple material layers 401-403 are depicted in FIGS. 4A-4D below the pattern, it is emphasized that the current disclosure is not limited to any specific layer configuration. In some embodiments, there is only one material layer below the pattern, in some embodiments there are two, and in some embodiments, there are three or more material layers below the pattern. The thickness of the layers may vary, as may their material, as long as they are sufficiently amenable to the etching method used in the process in question.

Figure 4B:
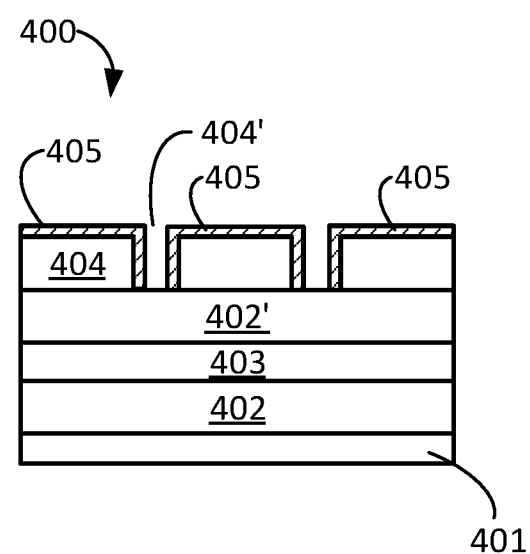

In FIG. 4B, a passivation layer 405 is conformally deposited on the patterned material layer 404, similarly to the embodiment of FIGS. 2A-2F.

In some embodiments, the material of the first structure 404 comprises carbon. In some embodiments, the first structure 404 consists essentially of or consists of carbon and hydrogen. In some embodiments, the carbon comprises, consists essentially of, or consists of amorphous carbon. In some embodiments, the carbon comprises, consists essentially of, or consists of spin-on carbon (SOC). In some embodiments, the material of the first structure 404 consists essentially of or consists of carbon and boron. In some embodiments, the first material 404 consists essentially of or consists of carbon-doped titanium nitride, titanium oxide or titanium oxynitride.

In some embodiments, the first structure 404 or the second material 402' is a photoresist. In some embodiments, the photoresist is a metalorganic resist (MOR). In some embodiments, the second material 402' is an underlayer.

In some embodiments, the second material 402' comprises silicon. In some embodiments, the second material 402' comprises, consists essentially of, or consists of a silicon-containing compound. In some embodiments, the silicon-containing compound is selected from a group consisting of $SiO_2$, SiN, SiON, SiC, SiOC, SiOCN. In some embodiments, the silicon-containing compound comprises a metal, such as aluminum or titanium.

In some embodiments, the second material 402' comprises silicon oxide. In some embodiments, the second material 402' comprises silicon nitride. In some embodiments, the second material 402' comprises silicon carbide. In some embodiments, the second material 402' comprises silicon oxycarbide. In some embodiments, the second material 402' comprises a combination of two or more compounds selected from silicon oxide, silicon nitride, silicon carbide and silicon oxycarbide.

The material under the patterned material layer 404, i.e. the surface that has been exposed by patterning of the patterned material layer 404, may vary, as explained in the preceding examples.

Figure 4C:
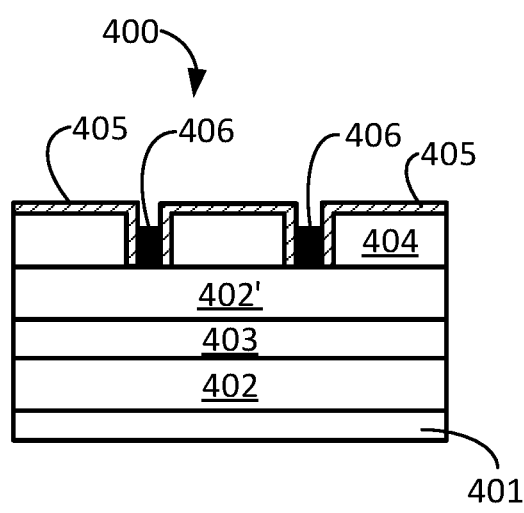

FIG. 4C shows the substrate 400 after etch-stop layer 406 has been deposited in the gap 404' of the patterned material layer 404. In the embodiment of FIG. 4C, the first material 404 may be titanium nitride, titanium oxide, titanium oxynitride or amorphous carbon and the second material 402' may be silicon oxide, silicon nitride, SOG, amorphous silicon or silicon oxycarbide. The gap 404' according to the current disclosure may have a width of, for example, from about 8 nm to about 150 nm, such as from about 10 nm to about 80 nm, or from about 20 nm to about 50 nm.

The second material 402' may be selectively blocked from the deposition of a passivation layer 404. In some embodiments, the substrate 400 is subjected to a blocking treatment, such as a silylation treatment described above, to obtain sufficient selectivity. Thus, in some embodiments, the method comprises selectively blocking the second material 402' before depositing the passivation layer 405 on the first material 404. In some embodiments, blocking comprises a silylation treatment. In such a case, the passivation layer 405 may be, for example organic polymer comprising polyimide. The polyimide passivation layer may comprise polyamic acid. In some embodiments, the organic polymer comprises polyimide. In some embodiments, the organic polymer consists essentially of polyimide.

Figure 4D:
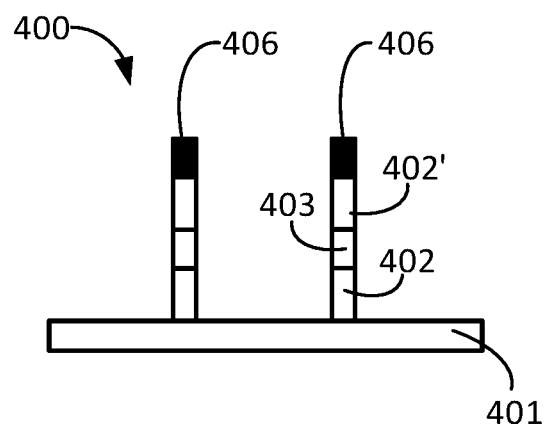

The etch-stop layer 406 is substantially not deposited on the passivation layer 405 covering the first structure 404. In case the passivation layer 404 comprises polyimide, metal oxides, such as aluminum oxide, zirconium oxide, hafnium oxide, yttrium-doped aluminum oxide or yttrium oxide may be used as the etch-stop layer 406 material. Depositing the passivation layer 405 allows the protection of the areas between the first structures 404 from subsequent etching, as depicted in FIG. 4D, in which the passivation layer 405, and any layers thereunder all the way to the silicon substrate 401 have been removed. As in the previous example, etching may be performed to a desired depth, leaving one or more layers intact.

Figure 5:
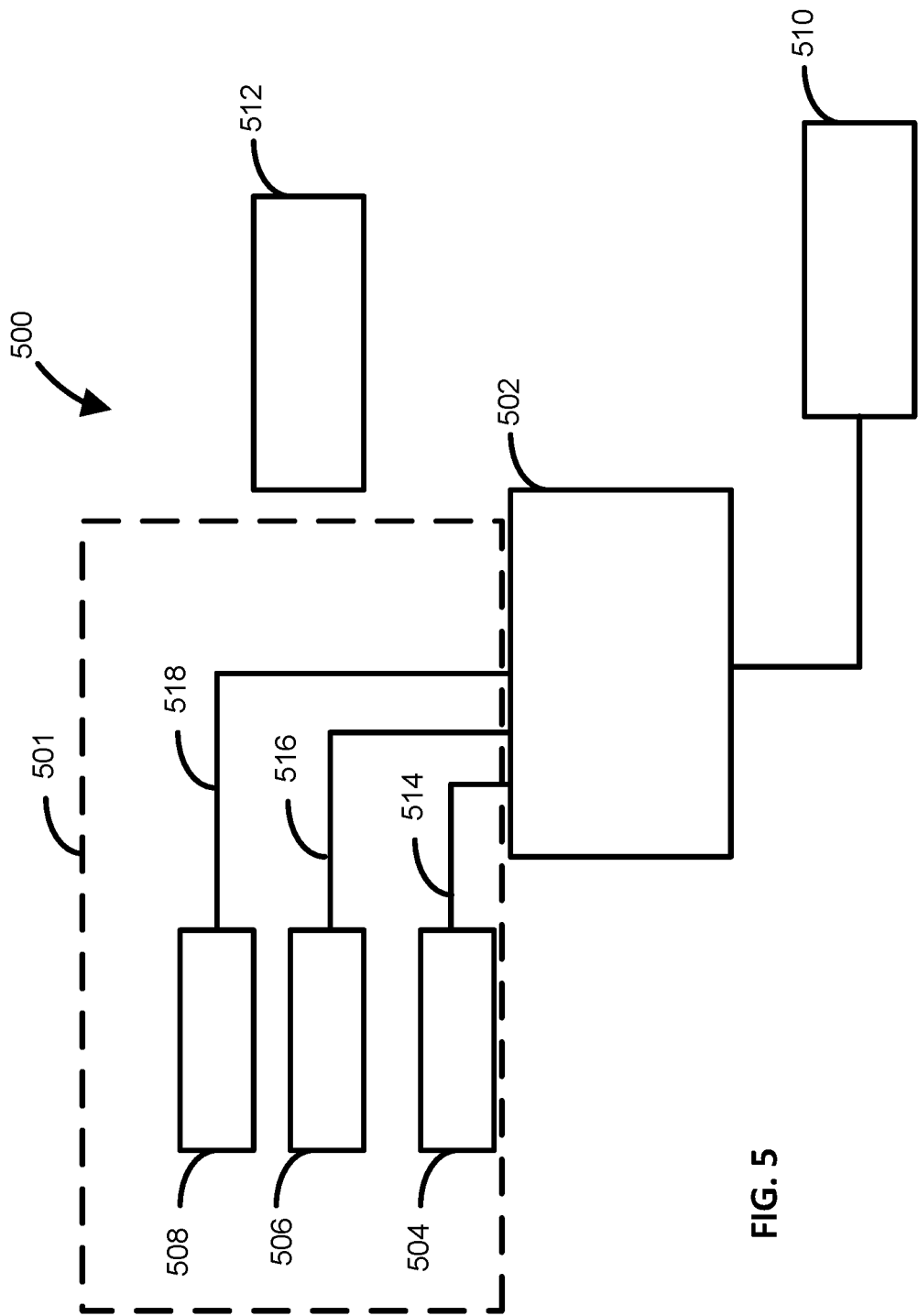
FIG. 5 is an illustrative processing assembly according to aspects of the current disclosure.

FIG. 5 illustrates a processing assembly 500 according to the current disclosure in a schematic manner. The processing assembly 500 can be used to perform a method as described herein and/or to form a structure or a device, or a portion thereof as described herein.

In the illustrated example, processing assembly 500 includes one or more reaction chambers 502, a precursor injector system 501, a passivation material precursor vessel 504, etch stop material precursor vessel 506, blocking reactant source 508, an exhaust source 510, and a controller 512. The processing assembly 500 may comprise one or more additional gas sources (not shown), such as an inert gas source, a carrier gas source and/or a purge gas source.

Reaction chamber 502 can include any suitable reaction chamber, such as an ALD or CVD reaction chamber as described herein.

The passivation material precursor vessel 504 can include a vessel and one or more passivation material precursors as described herein—alone or mixed with one or more carrier (e.g., inert) gases. Etch-stop material precursor vessel 506 can include a vessel and one or more etch-stop material precursors as described herein—alone or mixed with one or more carrier gases. Blocking reactant source 508 can include a blocking reactant, or a precursor thereof as described herein, such as a silylation reactant. Although illustrated with three source vessels 504-508, processing assembly 500 can include any suitable number of source vessels. Especially, for process phases in which two precursors are provided into the reaction chamber 502, two different precursors for each material may be needed. Source vessels 504-508 can be coupled to reaction chamber 502 via lines 514-518, which can each include flow controllers, valves, heaters, and the like. In some embodiments, the passivation material precursor in the passivation material precursor vessel 504, the etch-stop material precursor in the etch-stop material precursor vessel 506 and/or the blocking reactant in the blocking reactant vessel 508 may be heated.

Exhaust source 510 can include one or more vacuum pumps.

Controller 512 includes electronic circuitry and software to selectively operate valves, manifolds, heaters, pumps and other components included in the processing assembly 500. Such circuitry and components operate to introduce precursors, reactants and purge gases from the respective sources. Controller 512 can control timing of gas pulse sequences, temperature of the substrate and/or reaction chamber 502, pressure within the reaction chamber 502, and various other operations to provide proper operation of the processing assembly 500. Controller 512 can include control software to electrically or pneumatically control valves to control flow of precursors, reactants and purge gases into and out of the reaction chamber 502. Controller 512 can include modules such as a software or hardware component, which performs certain tasks. A module may be configured to reside on the addressable storage medium of the control system and be configured to execute one or more processes.

Other configurations of processing assembly 500 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 502. Further, as a schematic representation of a processing assembly, many components have been omitted for simplicity of illustration, and such components may include, for example, various valves, manifolds, purifiers, heaters, containers, vents, and/ or bypasses.

During operation of processing assembly 500, substrates, such as semiconductor wafers (not illustrated), are transferred from, e.g., a substrate handling system to reaction chamber 502. Once substrate(s) are transferred to reaction chamber 502, one or more gases from gas sources, such as precursors, reactants, carrier gases, and/or purge gases, are introduced into reaction chamber 502.

EXAMPLE EMBODIMENTS

Embodiment 1: A method for forming a patterned structure on a substrate, the method comprising
  providing the substrate comprising a first structure into a reaction chamber, wherein a surface of the first structure comprises a first material and the substrate comprises a second material;
  selectively depositing a conformal passivation layer on the first material relative to the second material to cover the first structure;
  selectively depositing an etch-stop layer on the second material relative to the passivation layer.

Embodiment 2: The method of Embodiment 1, wherein the first material comprises a metal.

Embodiment 3: The method of Embodiment 1 or 2, wherein the metal is a transition metal.

Embodiment 4: The method of Embodiment 3, wherein the transition metal is selected from a group consisting of molybdenum, copper, cobalt, ruthenium, tungsten, niobium, zirconium hafnium, yttrium and titanium.

Embodiment 5: The method of any of the preceding Embodiments, wherein the first material is a high k material.

Embodiment 6: The method of Embodiment 1, wherein the first material is carbon-based.

Embodiment 7: The method of any of the preceding Embodiments, wherein the second material comprises silicon.

Embodiment 8: The method of Embodiment 7, wherein the second material comprises silicon oxide, silicon nitride, silicon carbide, silicon oxycarbide, amorphous silicon, SOG or a combination thereof.

Embodiment 9: The method of any of the preceding Embodiments, wherein the second material comprises carbon.

Embodiment 10: The method of any of the preceding Embodiments, wherein the second material comprises an oxide or a nitride.

Embodiment 11: The method of any of the preceding Embodiments, wherein the passivation layer comprises an organic polymer.

Embodiment 12: The method of any of the preceding Embodiments, wherein the passivation layer is deposited by a cyclic process.

Embodiment 13: The method of Embodiment 12, wherein the cyclic process of depositing the passivation layer comprises providing a first passivation material precursor and a second passivation material precursor alternately and sequentially into the reaction chamber.

Embodiment 14: The method of any of Embodiments 12 or 13, wherein the organic polymer comprises polyimide.

Embodiment 15: The method of any of the preceding Embodiments, wherein the thickness of the passivation layer is from about 1 nm to about 30 nm.

Embodiment 16: The method of any of the preceding Embodiments, wherein the method comprises selectively blocking the second material before depositing the passivation layer on the first material.

Embodiment 17: The method of Embodiment 16, wherein the blocking comprises a silylation treatment.

Embodiment 18: The method of any of the preceding Embodiments, wherein the method further comprises etching the areas of the substrate not covered by the etch-stop layer.

Embodiment 19: The method of any of the preceding Embodiments, wherein the etch-stop layer comprises a metal oxide.

Embodiment 20: The method of Embodiment 19, wherein the metal of the etch-stop layer is selected from aluminum, yttrium, zirconium or combinations thereof.

Embodiment 21: The method of Embodiment 19 or 20, wherein the etch-stop layer comprises yttrium oxide.

Embodiment 22: The method of any of the preceding Embodiments, wherein the etch-stop layer is deposited by a cyclic deposition process.

Embodiment 23: The method of Embodiment 22, wherein the cyclic deposition process for the etch-stop layer comprises providing a first etch-stop material precursor and a second etch-stop material precursor into the reaction chamber alternately and sequentially.

Embodiment 24: The method of any of the preceding Embodiments, wherein the method comprises etching back the passivation layer anisotropically to partially reveal the first structure before depositing the etch-stop layer.

Embodiment 25: The method of Embodiment 24, wherein the anisotropic etching removes horizontal portions of the passivation layer.

Embodiment 26: The method of Embodiment 24 or 25, wherein the etching back comprises etching with hydrogen-comprising plasma.

Embodiment 27: The method of any of the preceding Embodiments, wherein the first material or the second material comprises hard mask material.

Embodiment 28: The method according to any of the preceding Embodiments, wherein the method comprises etching the substrate to remove material from portions not covered by the etch-stop layer.

Embodiment 29: A method of reversing patterning tone of a patterned substrate, the method comprising
  providing a substrate comprising a patterned hard mask into a reaction chamber, wherein a surface of the patterned hard mask comprises a first material and the hard mask is formed on a substrate comprising a second material;
  selectively depositing a conformal passivation layer on the first material relative to the second material to cover the patterned hard mask;

selectively depositing an etch-stop layer on the second material relative to the passivation layer; and selectively etching the substrate not covered by the etch-stop layer.

Embodiment 30: The method of Embodiment 29, wherein the pattern of the hard mask comprises a gap extending through the hard mask.

Embodiment 31: A method of reducing feature pitch on a substrate, wherein the method comprises providing a substrate comprising a patterned hard mask into a reaction chamber;

wherein a surface of the patterned hard mask comprises a first material and the hard mask is formed on a substrate comprising a second material;

selectively depositing a conformal passivation layer on the first material relative to the second material to cover the patterned hard mask;

anisotropically etching the passivation layer to remove horizontal portion of the passivation layer;

selectively depositing an etch-stop layer on the first material and the second material relative to the passivation layer; and selectively etching portions of the substrate covered by the passivation layer.

Embodiment 32: A semiconductor structure formed by a method of any of the preceding Embodiments.

Embodiment 33: A semiconductor device comprising a structure of Embodiment 32.

Embodiment 34: A semiconductor processing assembly for forming a patterned structure on a substrate comprising:

one or more reaction chambers constructed and arranged to hold the substrate;

a precursor injector system constructed and arranged to provide a passivation material precursor and an etch stop material precursor into the reaction chamber in a vapor phase;

wherein the processing assembly comprises a first precursor vessel constructed and arranged to contain a passivation material precursor and a second precursor vessel constructed and arranged to contain an etch stop material precursor;

and the processing assembly is constructed and arranged to provide the passivation material precursor and the etch stop material precursor via the precursor injector system to the reaction chamber to selectively deposit an etch-stop layer on the patterned substrate.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of reversing patterning tone of a patterned substrate, the method comprising providing the substrate comprising a patterned hard mask into a reaction chamber, wherein a surface of the patterned hard mask comprises a first material and the hard mask is formed on the substrate comprising a second material;

selectively depositing a conformal passivation layer on the first material relative to the second material to cover the patterned hard mask;

selectively depositing an etch-stop layer on the second material relative to the passivation layer; and selectively etching areas of the substrate not covered by the etch-stop layer.

2. The method of claim 1, wherein the pattern of the hard mask comprises a gap extending through the hard mask.

3. The method of claim 1, wherein the first material comprises a metal.

4. The method of claim 1, wherein the first material is carbon-based.

5. The method of claim 1, wherein the second material comprises silicon.

6. The method of claim 5, wherein the second material comprises a silicon containing compound comprising a metal including aluminum or titanium.

7. The method of claim 5, wherein the second material comprises silicon oxide, silicon nitride, SOG, amorphous silicon, silicon oxycarbide, or compounds thereof.

8. The method of claim 1, wherein the second material comprises an oxide or a nitride.

9. The method of claim 1, wherein the passivation layer comprises an organic polymer.

10. The method of claim 9, wherein the organic polymer comprises polyimide.

11. The method of claim 9, further comprising selectively blocking the second material before depositing the passivation layer on the first material.

12. The method of claim 10, wherein the blocking comprises performing a silylation treatment.

13. The method of claim 1, wherein the etch-stop layer comprises a metal oxide.

14. The method of claim 1, wherein the second material is a metalorganic resist (MOR).

15. The method of claim 1, wherein the etch-stop layer is deposited by a cyclic deposition process comprising providing a first etch-stop material precursor and a second etch-stop material precursor into the reaction chamber alternately and sequentially.

* * * * *